US008964826B2

(12) United States Patent
Agrawal et al.

(10) Patent No.: US 8,964,826 B2
(45) Date of Patent: Feb. 24, 2015

(54) TIME DOMAIN ANALOG MULTIPLICATION TECHNIQUES FOR ADJUSTING TAP WEIGHTS OF FEED-FORWARD EQUALIZERS

(71) Applicant: International Business Machines Corporation, Armonk, NY (US)

(72) Inventors: Ankur Agrawal, White Plains, NY (US); John F. Bulzacchelli, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 13/763,659

(22) Filed: Feb. 9, 2013

(65) Prior Publication Data

US 2013/0208782 A1    Aug. 15, 2013

Related U.S. Application Data

(60) Provisional application No. 61/597,491, filed on Feb. 10, 2012.

(51) Int. Cl.
*H03H 7/30*     (2006.01)
*H04L 25/03*    (2006.01)
(Continued)

(52) U.S. Cl.
CPC .......... *H04L 25/03878* (2013.01); *H04L 27/01* (2013.01); *H03K 5/135* (2013.01); *H03K 2005/00052* (2013.01); *H03K 2005/00065* (2013.01)
USPC ............................ 375/232; 375/230; 375/233

(58) Field of Classification Search
CPC ............... H04L 25/03012; H04L 2025/03445; H04L 27/01; H04L 25/0378; H04L 25/03267
USPC .................. 375/229, 230, 232, 233
See application file for complete search history.

(56) References Cited

U.S. PATENT DOCUMENTS 3,716,807 A    2/1973   Sha et al.
3,758,863 A    9/1973   Ungerboeck
(Continued)

OTHER PUBLICATIONS

L. Chen et al., "A Scalable 3.6-to-5.2mW 5-to10Gb/s 4-Tap DFE in 32nm CMOS," IEEE International Solid-State Circuits Conference (ISSCC)—Digest of Technical Papers, Feb. 2009, pp. 180-181.
A. Momtaz et al., "An 80 mW 40 Gb/s 7-Tap T/2-Spaced Feed-Forward Equalizer in 65 nm CMOS," IEEE Journal of Solid-State Circuits, Mar. 2010, pp. 629-639, vol. 45, No. 3.
H.R. Schindler et al., "Signal Correlator," www.ip.com, IPCOM000066351D, Feb. 2005, 3 pages.
(Continued)

*Primary Examiner* — Sophia Vlahos
(74) *Attorney, Agent, or Firm* — Anne V. Dougherty; Ryan, Mason & Lewis, LLP

(57) ABSTRACT

Feed-forward equalizer (FFE) circuits and methods are provided which implement time domain analog multiplication for adjusting FFE tap weights. For example, a method includes inputting data signals to FFE taps of a current-integrating summer circuit, wherein the data signals are time-delayed versions of an analog input data signal. A capacitance is charged to a precharge level during a reset period of the current-integrating summer circuit. An output current is generated by each FFE tap during an integration period of the current-integrating summer circuit. The output currents from the FFE taps collectively charge or discharge the capacitance during the integration period. A gating control signal is applied to a given FFE tap during the integration period to enable the given FFE tap during a portion of the integration period in which the gating control signal overlaps the integration period so as to effectively multiply the data signal input to the given FFE tap with an FFE coefficient value corresponding to a period of overlap between the gating control signal and the integration period.

21 Claims, 9 Drawing Sheets

(51) Int. Cl.
*H04L 27/01* (2006.01)
*H03K 5/135* (2006.01)
*H03K 5/00* (2006.01)

(56) References Cited

U.S. PATENT DOCUMENTS

| | | | |
|---|---|---|---|
| 5,388,123 | A | 2/1995 | Uesugi et al. |
| 5,530,721 | A | 6/1996 | Inoue et al. |
| 6,055,269 | A | 4/2000 | Drost et al. |
| 7,106,099 | B1 | 9/2006 | Nix |
| 7,283,586 | B2 | 10/2007 | Upton |
| 7,321,621 | B2 | 1/2008 | Popescu et al. |
| 7,542,508 | B2 | 6/2009 | Marlett et al. |
| 7,574,146 | B2 | 8/2009 | Chiang et al. |
| 7,738,567 | B2 | 6/2010 | Miller et al. |
| 7,809,054 | B2 | 10/2010 | Carballo et al. |
| 7,835,387 | B2 | 11/2010 | Agazzi et al. |
| 8,085,841 | B2 * | 12/2011 | Bulzacchelli et al. ........ 375/233 |
| 8,755,428 | B2 * | 6/2014 | Agrawal et al. ............... 375/232 |
| 2007/0058710 | A1 | 3/2007 | Chang |
| 2007/0133671 | A1 | 6/2007 | Tsai |
| 2008/0247453 | A1 | 10/2008 | An et al. |
| 2010/0046683 | A1 | 2/2010 | Beukema et al. |

OTHER PUBLICATIONS

N.P. Kelly et al., "A Mixed-Signal DFE/FFE Receiver for 100Base-TX Applications," IEEE International Solid-State Circuits Conference, 2000, 2 pages.

S. Sidiropoulos et al., "A 700-Mb/s/pin CMOS Signaling Interface Using Current Integrating Receivers," IEEE Journal of Solid-State Circuits, May 1997, pp. 681-690, vol. 32, No. 5.

T. Beukema et al., "A 6.4-Gb/s CMOS SerDes Core with Feed-Forward and Decision-Feedback Equalization," IEEE Journal of Solid State Circuits, Dec. 2005, pp. 2633-2645, vol. 40, No. 12.

J.E. Jaussi et al., "An 8-Gb/s Source-Synchronous I/O Link with Adaptive Receiver Equalization, Offset Cancellation, and Clock-DeSkew," IEEE International Solid-State Circuits Conference (ISSCC)—Digest of Technical Papers, Feb. 2004, 10 pages, vol. 1.

S. Reynolds et al., "A 7-Tap Transverse Analog-FIR Filter in 0.12 μm CMOS for Equalization of 10Gb/s Fiber-Optic Data Systems," IEEE International Solid-State Circuits Conference (ISSCC)—Digest of Technical Papers, Feb. 2005, pp. 330-331, 601, vol. 1.

M. Park et al., "A 7 Gb/s 9.3 mW 2-Tap Current-Integrating DFE Receiver," IEEE International Solid-State Circuits Conference (ISSCC)—Digest of Technical Papers, Feb. 2007, pp. 230-231, 599.

* cited by examiner

100

200

300

400

500

600

700

TIME DOMAIN ANALOG MULTIPLICATION TECHNIQUES FOR ADJUSTING TAP WEIGHTS OF FEED-FORWARD EQUALIZERS

CROSS-REFERENCE TO RELATED APPLICATION

This application claims priority to U.S. Provisional Patent Application Ser. No. 61/597,491, filed on Feb. 10, 2012, which is incorporated herein by reference.

TECHNICAL FIELD

The field relates generally to feed-forward equalizer (FFE) architectures and, in particular, FFE circuits and methods implementing time domain analog multiplication for adjusting FFE tap weights.

BACKGROUND

A feed-forward equalizer circuit is a transversal filter that may be employed in multi-gigabit/s serial link transceivers to compensate for the frequency dependent loss of communication channels. Since these channels typically have a low-pass transfer function, an FFE is programmed to have high-pass characteristics to effectively compensate for the channel transfer function and reduce intersymbol interference introduced by the channel. In principle, an FFE can be implemented in either a transmitter or a receiver.

Traditionally, FFE realization in the transmitter has been preferred due to its ease of implementation and lower power and area costs. However, placing an FFE in the transmitter has important disadvantages. Since the quality of the received signal is only known in the receiver, automatic adaptation of the FFE coefficients for optimum link performance requires a back channel from receiver to transmitter, something which is often unavailable (especially when the transmitter and receiver are sourced from different vendors). Since the peak voltage swing of the transmitter is limited by available supply voltages, transmit-side FFE compensates for high-frequency loss in the channel not by increasing the amplitudes of high-frequency signals but by decreasing the amplitudes of low-frequency signals. This results in a smaller received signal, which is more vulnerable to noise sources such as crosstalk.

One way to avoid the disadvantages of transmit-side FFE is to implement the equalizer in the receiver. To avoid the difficulties of implementing an actual receive-side FFE, peaking amplifiers are commonly employed in serial link receivers. However, peaking amplifiers do not provide enough flexibility in the placement of their poles and zeroes, making it difficult to accurately match the equalizer to the channel characteristics. Moreover, peaking amplifiers are not compatible with well-known equalizer adaptation algorithms (e.g. Least Mean Squares or LMS). Thus, there is a strong motivation to develop circuit techniques that overcome the practical difficulties of implementing receive-side FFE systems.

SUMMARY

Embodiments of the invention generally include FFE architectures and, in particular, FFE circuits and methods implementing time domain analog multiplication for adjusting FFE tap weights.

In one embodiment of the invention, a feed-forward equalization circuit includes delay circuitry, a current-integrating summer circuit, and a gating signal generator circuit. The delay circuitry generates n time-delayed versions of an analog input data signal. The gating signal generator circuit receives a clock signal and an FFE coefficient value and generates a gating control signal based on the clock signal and the FFE coefficient value. The gating control signal has a phase-shift with respect to a reset control signal. The reset control signal defines a reset period and an integration period for the current-integrating summer circuit. The phase-shift provides an overlap period between the gating control signal and the integration period, which corresponds to the FFE coefficient value. The current-integrating summer circuit includes a first power supply node, an output node and a first switch connected between the first power supply node and the output node. The first switch is responsive to the reset control signal to connect the output node to the first power supply node and precharge a capacitance of the output node during the reset period, and to disconnect the output node from the first power supply node during the integrating period. The current-integrating summer circuit further includes m transconductance amplifier circuits connected to the output node, wherein each of the m transconductance amplifier circuits receives an input data signal corresponding to one of the n time-delayed versions of the analog input data signal, and generates an output current on the output node, wherein the output currents from the m transconductance amplifier circuits collectively charge or discharge the capacitance of the output node during the integration period. At least one transconductance amplifier circuit of the m transconductance amplifier circuits includes a gating control circuit that is responsive to the gating control signal generated by the gating signal generator circuit, to enable the at least one transconductance amplifier circuit to generate an output current only during the overlap period between the gating control signal and the integration period so as to effectively multiply the input data signal with the FFE coefficient value corresponding to the overlap period.

Another embodiment of the invention includes a method for equalizing a data signal. The method includes inputting data signals to FFE taps of a current-integrating summer circuit, wherein the data signals are time-delayed versions of an analog input data signal. A capacitance is charged to a precharge level during a reset period of the current-integrating summer circuit. An output current is generated by each FFE tap during an integration period of the current-integrating summer circuit. The output currents from the FFE taps collectively charge or discharge the capacitance during the integration period. A gating control signal is applied to a given FFE tap during the integration period to enable the given FFE tap during a portion of the integration period in which the gating control signal overlaps the integration period so as to effectively multiply the data signal input to the given FFE tap with an FFE coefficient value corresponding to a period of overlap between the gating control signal and the integration period. The gating control signal can be adjusted to vary the period of overlap between the gating control signal and the integration period.

These and other embodiments of the invention will become apparent from the following detailed description, which is to be read in conjunction with the accompanying drawings.

DETAILED DESCRIPTION

Figure 1:
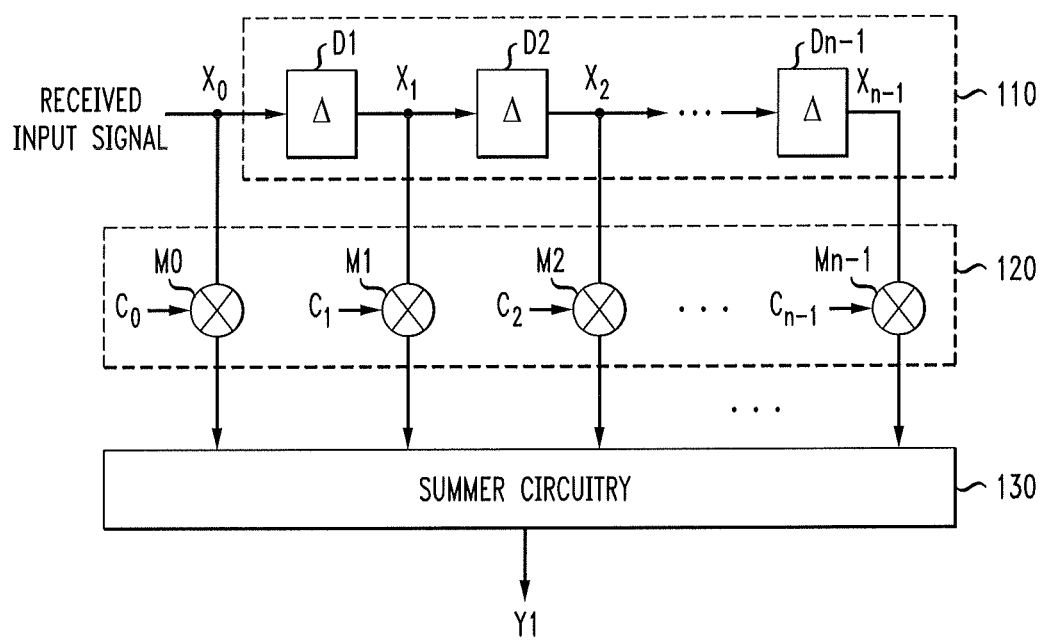
FIG. 1 is a block diagram of a feed-forward equalizer circuit.

FIG. 1 is a block diagram of a feed-forward equalizer architecture for which embodiments of the invention can be implemented. In particular. FIG. 1 illustrates a receive-side n-tap feed-forward equalizer circuit 100 comprising delay circuitry 110, multiplication circuitry 120 comprising a plurality of analog multipliers (M0, M1, . . . , Mn−1), and summer circuitry 130. The delay circuitry 110 comprises a plurality of delay cells (D1, D2, . . . , Dn−1). An input signal $X_0$ is input to the delay circuitry 110, wherein the delay cells (D1, D2, . . . , Dn−1) generate respective delayed versions $(X_1, X_2, \ldots, X_{n-1})$ of the input signal $X_0$. The signals $(X_0, X_1, X_2, \ldots, X_{n-1})$ are input to respective analog multipliers (M0, M1, M2, . . . , Mn−1), where they are multiplied (weighted) with respective FFE weighting coefficients $(C_0, C_1, C_2, \ldots, C_{n-1})$. The outputs of the analog multipliers (M0, M1, M2, . . . , Mn−1) are summed in the summer circuitry 130 to generate an equalized signal $y_1$. In the embodiment of FIG. 1, the delayed signal $X_1$ may be deemed a main-cursor, where the input signal $X_0$ is a pre-cursor, and the delayed signals $(X_2, \ldots, X_{n-1})$ are post-cursors.

The delay circuitry 110 can be implemented using analog delay circuitry that generates multiple time-delayed versions of the input data signal available simultaneously. Conceptually, the delay lines are analog shift registers that delay the incident data signal by a precise amount without introducing any distortions to the analog signal. The delay lines may be active or passive delay cells. Alternatively, the delay circuitry 110 of FIG. 1 can be implemented using a bank of parallel sample-and-hold (S/H) circuits that are clocked by multiphase clocks, to thereby generate multiple time-delayed versions of an input signal.

Furthermore, the weighted signals output from the multiplication circuitry 120 can be summed via the summer circuitry 130 using techniques similar to those employed in decision-feedback equalizers (DFEs). There is, however, no easy way to implement the coefficient multiplication. Because the received input signal is an analog signal, FFE coefficient multiplication involves analog multiplication in which one analog quantity (the received analog signal) is multiplied by another analog or high-resolution digital quantity (the FFE coefficient). In silicon bipolar technology, analog multiplication can be realized with a traditional Gilbert multiplier cell, but in CMOS technology (which is the technology of choice for most multi-Gb/s serial link circuits), device characteristics make Gilbert-style multipliers far less accurate, and the resulting distortion could degrade FFE performance.

Embodiments of the invention include FFE architectures that employ an accurate and hardware-efficient solution for multiplying a received analog input signal by FFE coefficients. More specifically, embodiments of the invention implement time domain analog multiplication techniques for adjusting tap weights of a current-integrating FEE summer circuit. As explained in further detail below, an n-tap FFE current-integrating summer circuit is employed to add a plurality of n signals that represent samples of a received analog input signal (with various delays), wherein coefficient weighting of the various n data signals is achieved by varying a time duration over which currents generated by respective current-integrating amplifier stages (FFE taps) are integrated during an "integration period" by means of gating control signals. Furthermore, as explained in detail below, for an n-tap FFE, only (n−1) digital-to-analog converters (DACs) are needed for setting the FFE coefficients, wherein a number of required DACs is independent of a number of parallel data paths in a receiver system.

Figure 2:
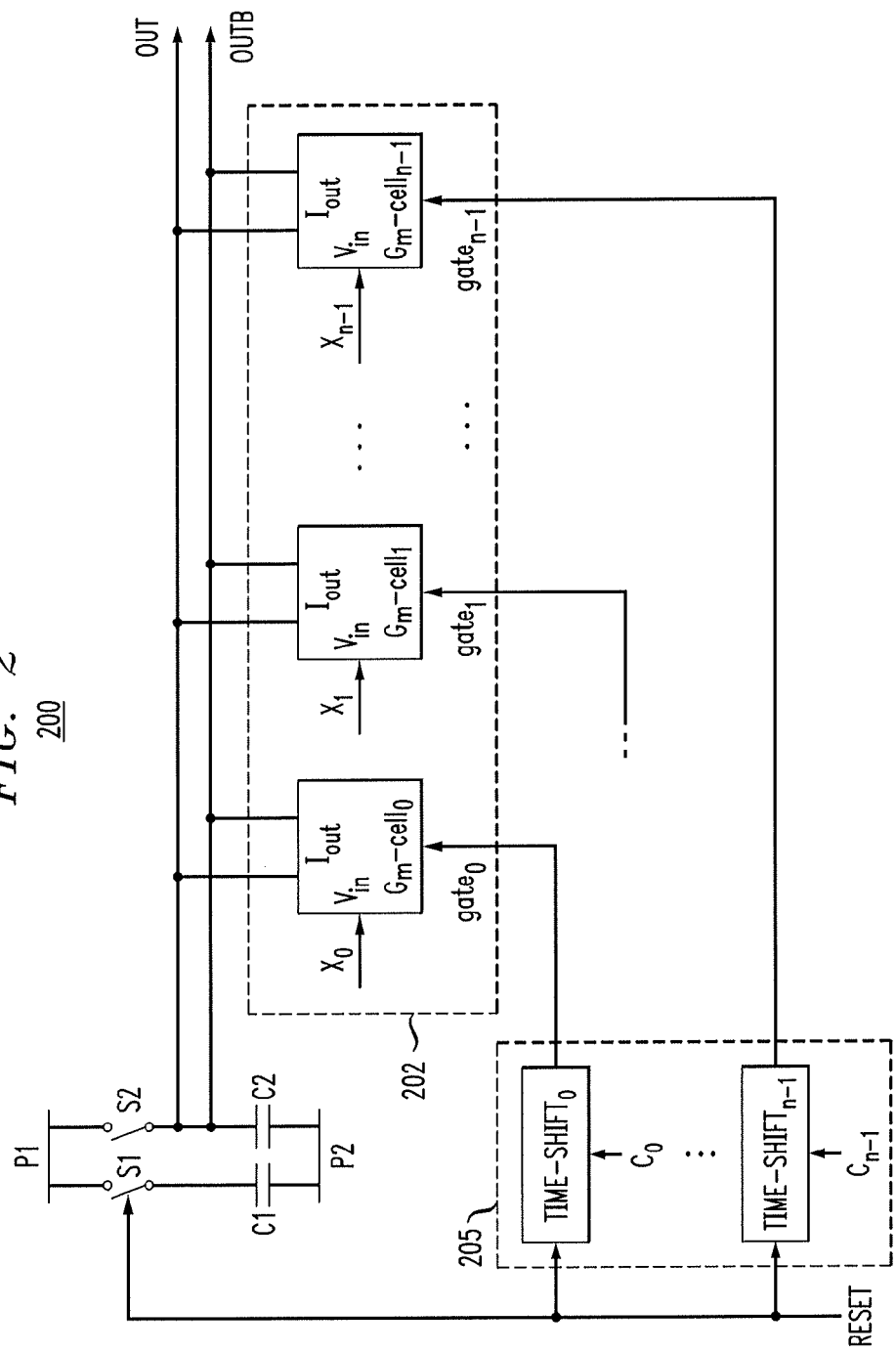
FIG. 2 is a block diagram of an n-tap FFE current-integrating summer circuit that implements time domain analog multiplication for adjusting FFE tap weights, according to an embodiment of the invention.

FIG. 2 is a block diagram of a current-integrating summer circuit according to an embodiment of the invention. In particular, FIG. 2 illustrates an n-tap FEE current-integrating summer circuit that implements time domain analog multiplication for adjusting FFE tap weights, according to an embodiment of the invention. The current-integrating summer circuit 200 comprises a plurality of transconductance cells 202 (or $G_m$-cells) whose output nodes are commonly connected to first and second differential output nodes OUT and OUTB. The transconductance cells 202 shown in FIG. 2 comprise a plurality (n) of $G_m$-cells ($G_m$-cell$_0$, $G_m$-cell$_1$, . . . , $G_m$-cell$_{n-1}$) for implementing an n-tap feed-forward equalizer, as will be explained in further detail below. The current-integrating summer circuit 200 further comprises first and second switches S1 and S2, first and second capacitors C1 and C2, and a timing signal generator circuit 205. The timing signal generator circuit 205 comprises a plurality (n) of time-shift cells (time-shift$_0$, . . . , time-shift$_{n-1}$). The first and second switches S1 and S2 are connected between a first power supply node P1 and the first and second differential output nodes OUT and OUTB, respectively. The first and second capacitors C1 and C2 are connected between a second power supply node P2 and the first and second differential output nodes OUT and OUTB, respectively.

In one embodiment of the invention, the first and second capacitors C1 and C2 may be explicit capacitor elements connected to the output nodes OUT and OUTB. In another embodiment of the invention, the capacitors C1 and C2 represent parasitic capacitances of the respective output nodes OUT and OUTB, wherein the parasitic capacitances C1 and C2 represent a total parasitic capacitance associated with wiring and devices. In one embodiment of the invention, the first and second power supply nodes P1 and P2 may be connected to the same power supply voltage (e.g., VDD). In another embodiment, the first and second power supply nodes P1 and P2 may be connected to different power supply voltages. In another embodiment, one of the first and second power supply nodes P1 and P2 may be grounded and the other one connected to a power supply voltage.

The timing signal generator circuit 205 receives as input a reset control signal and generates a plurality of gating control signals, $gate_0$, $gate_1$, ..., $gate_{n-1}$, which are input to respective transconductance cells $G_m$-$cell_0$, $G_m$-$cell_1$, ..., $G_m$-$cell_{n-1}$, to enable or disable the respective transconductance cells depending on the polarity of the gating control signals. The reset control signal is a clock waveform, alternating between high and low voltage levels, that sets a "reset period" and "integration period" for the current-integrating summer circuit 200. The reset control signal switchably controls the first and second switches S1 and S2. During a "reset period," the first and second switches S1 and S2 are closed (activated) in response to the reset control signal. As such, the first and second capacitors C1 and C2 are connected to the first power supply node P1 and precharged to a voltage $V_{precharge}$. During an "integration period,", the first and second switches S1 and S2 are opened (deactivated) in response to the reset signal. As such, the first and second capacitors C1 and C2 are disconnected from the first power supply node P1 and integrate the output currents ($I_{out}$) from each of the transconductance cells 202 to develop a differential voltage at the first and second differential output nodes OUT and OUTB.

In particular, during an "integration period,", each transconductance cell $G_m$-$cell_0$, $G_m$-$cell_1$, ..., $G_m$-$cell_{n-1}$ (generally, $G_m$-$cell_k$) converts its respective input voltage $X_0$, $X_1$, ..., $X_{n-1}$ (generally, $X_k$) to an output current, Iout, when a respective gating control signal, $gate_0$, $gate_1$, ..., $gate_{n-1}$, (generally, $gate_k$) overlaps with the time interval of the integration period. Each time-shift cell, time-$shift_0$, ..., time-$shift_{n-1}$ (generally, time-shift $cell_k$), adds programmable delay to an input clock (reset signal) to produce the respective gating signals, $gate_0$, $gate_1$, ..., $gate_{n-1}$, based on respective FFE coefficients, $C_0$, $C_1$, ..., $C_{n-1}$ (generally, $C_k$). In other words, each gating control signal $gate_k$ is a time-shifted version of the reset signal, where the time-shift is proportional to given FFE coefficient value $C_k$ applied to the given cell time-$shift_k$. The FFE coefficients $C_k$ may be analog or digital values. A given one of the transconductance cells $G_m$-$cell_k$ in FIG. 2 can be designated as a main cursor, wherein the main cursor may or may not require a gating signal. When no gating control signal is used to gate the main cursor FFE tap, then only (n−1) time-shifters are needed to implement an n-tap FFE. These concepts are further illustrated by FIGS. 3A and 3B.

Figure 3A:
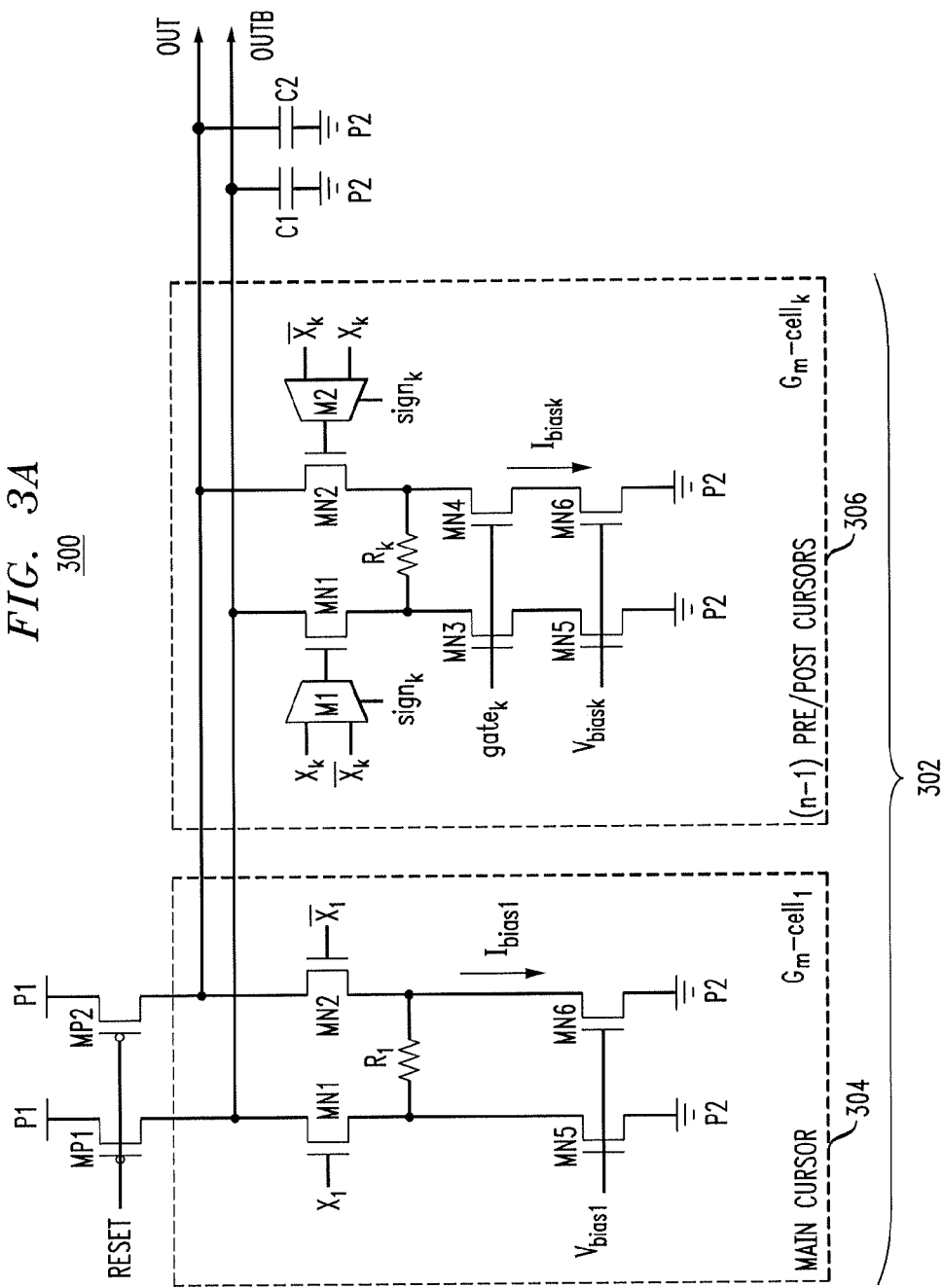
FIG. 3A is a schematic circuit diagram of a current-integrating summer circuit according to an embodiment of the invention, which is based on the general framework of FIG. 2.

FIG. 3A is a schematic circuit diagram of a current-integrating summer circuit according to an embodiment of the invention, which is based on the general framework of FIG. 2. In particular, FIG. 3A shows an n-tap FFE current-integrating summer 300 comprising a plurality of transconductance cells 302, first and second PMOS transistors MP1 and MP2, and first and second capacitors C1 and C2. The first and second PMOS transistors MP1 and MP2 are connected between a first power supply node P1 and the second and first output nodes OUTB and OUT, respectively. The PMOS transistors MP1 and MP2 are embodiments of the first and second switches S1 and S2 shown in FIG. 2. The first and second capacitors C1 and C2 are connected between the output nodes OUTB and OUT, respectively, and a second power supply node P2 (e.g., ground).

As further depicted in FIG. 3A, the transconductance cells 302 comprise n FFE taps including a main cursor FFE tap 304 and a plurality (n−1) of pre-cursor and post-cursor FFE taps 306. Each of the pre-cursor and post-cursor FFE taps 306 has a transconductance cell ($G_m$-$cell_k$) architecture as shown in FIG. 3A. In particular, each transconductance cell $G_m$-$cell_k$ forming the pre cursor and post cursor FFE taps 306 includes a differential input stage comprising a differential input pair of NMOS transistors MN1 and MN2, a source degeneration resistor $R_k$, NMOS switches MN3 and MN4, and NMOS tail transistors MN5 and MN6. Each transconductance cell $G_m$-$cell_k$ further includes first and second multiplexers M1 and M2 that select between an input data signal $X_k$ and its complement $\overline{X_k}$ based on a select control signal, $sign_k$, applied to a select control port of the first and second multiplexers M1 and M2, to implement a sign (i.e., + or −) of the FFE coefficient. The outputs of the multiplexers M1 and M2 are connected to gate terminals of the differential input pair of transistors MN1 and MN2. The differential input pair of transistors MN1 and MN2 have drain terminals that are connected to the output nodes OUTB and OUT, respectively. The first and second capacitors C1 and C2 serve as resettable load capacitors for the differential input pair of transistors MN1 and MN2. For highest power efficiency, the first and second capacitors C1 and C2 may be realized as parasitic capacitances of associated wiring and devices, as noted above.

Moreover, the NMOS transistors MN3 and MN4 have commonly connected gate terminals that receive a gating control signal, $gate_k$, which serves to enable or disable the given transconductance cell $G_m$-$cell_k$. The gating signals, $gate_k$, for the respective pre-cursor and post-cursor FFE taps 306 are generated by the timing signal generator circuit 205 (shown in FIG. 2). As explained in further detail below with reference to FIG. 3B, the gating operation enables efficient implementation of FFE coefficient multiplication. Moreover, the tail transistors MN5 and MN6 are NMOS transistors that serve as tail current sources to generate a bias current $I_{biask}$ to bias the differential input stage, based on a bias voltage $V_{biask}$ that is commonly applied to the gate terminals of transistors MN5 and MN6. The degeneration resistor $R_k$ and two separate tail current sources MN5 and MN6 provide resistive source degeneration, which improves the linearity of the transconductance cell, $G_m$-$cell_k$.

The main cursor FFE tap 304 shown in FIG. 3A is a source-degenerated linear transconductance amplifier, which is similar to the transconductance cells $G_m$-$cell_k$ implementing the pre-cursor and post-cursor FFE taps 306, except that the main cursor FFE tap 304 does not include the sign select multiplexers M1 and M2 and gating transistors MN3 and MN4. While the general framework of FIG. 2 shows an n-tap FFE current-integrating summer circuit 200 with gating applied to all transconductance cells 202, the embodiment of FIG. 3A eliminates gating control for the main cursor FFE tap. The n-tap FFE current-integrating summer circuit 300 of FIG. 3A may comprise n transconductance cells 302 (e.g. $G_m$-$cell_0$, ($G_m$-$cell_1$, $G_m$-$cell_2$ ..., $G_m$-$cell_{n-1}$) where the transconductance cell $G_m$-$cell_0$ is a pre-cursor FFE tap, the transconductance cell $G_m$-$cell_1$, is a main cursor FFE tap, and the remaining transconductance cells (e.g., $G_m$-$cell_2$ through $G_m$-$cell_{n-1}$) are post-cursor FFE taps. The main cursor FFE tap is a source-degenerated linear transductor having an effective voltage gain given by:

$$G_m \cdot T/C \qquad \text{Eqn. (1)}$$

where $G_m$ is the transconductance of the stage, T is the duration of integration (typically 1 or 2 unit intervals), and C is the capacitance at the output nodes (in FIG. 3A C1=C2=C).

In general, the n-tap FFE current-integrating summer circuit 300 of FIG. 3A performs coefficient multiplication and sums up weighted input signals to produce an equalized signal at the output nodes OUT and OUTB. The timing signal generator circuit 205 (shown in FIG. 2) generates gating signals that are time-shifted (delayed) with respect to the integration period to realize time-domain multiplication by varying the integration time of the transconductance cells 306 that process the pre-cursor and post-cursor FFE signals. The overlap between the reset signal and a given gating signal, $gate_k$, sets the effective FFE coefficient of the given transconductance cell $G_m\text{-cell}_k$. A time domain-based analog multiplication operating mode of the n-tap FFE current-integrating summer circuit 300 of FIG. 3A will now be explained in further detail with reference to FIG. 311.

Figure 3B:
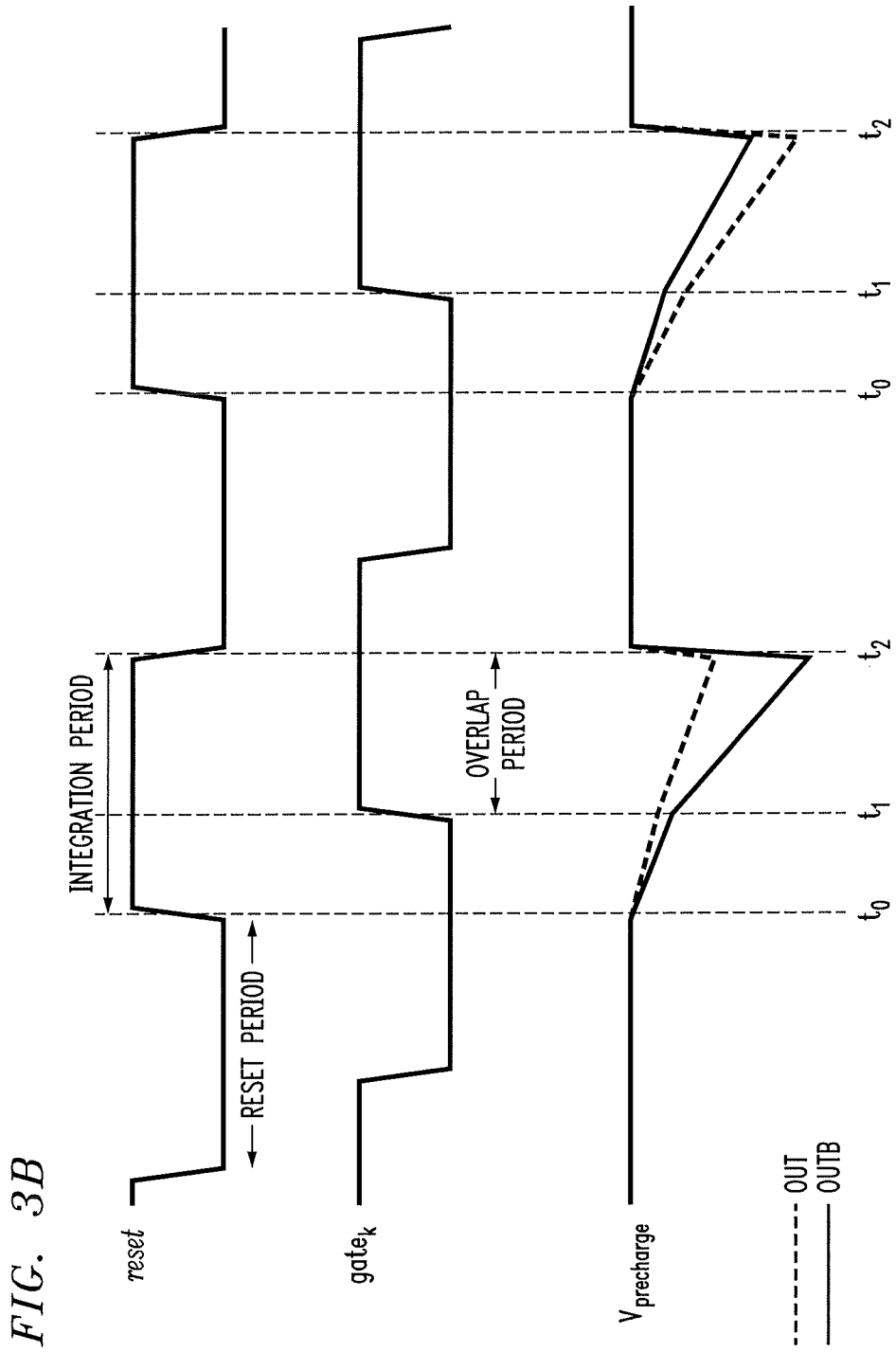
FIG. 3B shows example waveforms that illustrate an operating mode of the current-integrating summer circuit of FIG. 3A, according to an embodiment of the invention.

FIG. 3B shows example waveforms that illustrate an operating mode of the n-tap FFE current-integrating summer circuit 300 of FIG. 3A, according to an embodiment of the invention. FIG. 3B illustrates a reset control signal which is applied to the gate terminals of the PMOS transistors MP1 and MP2, and which is input to the time-shift cells (time-shift$_0$, . . . , time-shift$_{n-1}$) of the timing signal generator circuit 205 (FIG. 2). The reset control signal is a clock waveform, alternating between high and low voltage levels, which sets a "reset period" and an "integration period" of the current-integrating summer circuit 300. The integration period is shown in FIG. 3B to span a time interval from time to $t_0$ time $t_2$. For purposes of clarity. FIG. 3B further illustrates one gating control signal, $gate_k$, which is applied to one of the pre-cursor/post-cursor FFE tap transconductance cells 306 in FIG. 3A. The gating control signal, $gate_k$, is a time-shifted version of the reset control signal, wherein a rising edge of the gate control signal, $gate_k$, occurs at time $t_1$, after the rising edge of the reset signal at time $t_0$, such that assertion of the gate control signal is time delayed for a time $t_1 - t_0$. Moreover. FIG. 3B illustrates output voltage waveforms that are generated on the first and second differential output nodes OUT and OUTB based on the main cursor FFE tap 304 and the one pre/post-cursor FFE tap 306 controlled by the gating control signal, $gate_k$.

In operation, as shown in FIG. 3B, when the reset control signal is logic low, the current-integrating summer circuit 300 is in reset mode for a given "reset period." During the reset period, the PMOS transistors MP1 and MP2 are activated (turned on) in response to a logic low level of the reset control signal applied to the gate terminals thereof. With PMOS transistors MP1 and MP2 activated, the first and second differential output nodes OUT and OUTB are pulled up to the first power supply node P1 and precharged to a voltage level $V_{precharge}$ (e.g., approximately VDD).

As further shown in FIG. 3B, when the reset control signal transitions to logic high, the current-integrating summer circuit 300 enters an integration mode for a given "integration period." During the integration period, the PMOS transistors MP1 and MP2 are deactivated (turned off) in response to a logic high level of the reset control signal applied to the gate terminals thereof. With PMOS transistors MP1 and MP2 deactivated, at the beginning of the integration period, the drain currents of the differential input pair of NMOS transistors MN1 and MN2 of the main cursor FFE tap 304 (which are driven by respective inputs $X_1$ and $\overline{X_1}$) begin to discharge the first and second load capacitors C1 and C2. In other words, at the beginning of the integration period (e.g., time period from $t_0$ to $t_1$), the capacitors C1 and C2 only integrate the current output from the main cursor FFE tap 304. When the gating signal $gate_k$ is asserted (at time $t_1$), the capacitors C1 and C2 at the differential output nodes OUT and OUTB integrate the currents of the main cursor FFE tap 304 and the corresponding pre/post-cursor FFE tap 306 that is enabled by the assertion of the gating control signal, $gate_k$. As more pre/post-cursor FFE taps 306 are enabled by their respective gating control signals, the average rate of discharge of the first and second capacitors C1 and C2 increases, while the rate of differential voltage generated on the output nodes OUT/OUTB can increase or decrease depending on the signs of the input signals and the tap coefficients.

The effective FFE coefficient of a given FFE tap is proportional to an "overlap period" between the "integration period" and the gating control signal, $gate_k$, of the given FFE tap. For example, as shown in FIG. 3B, the overlap period between the reset signal and the gating control signal, $gate_k$, is a time period from $t_1$ to $t_2$. A maximum FFE coefficient (e.g., weight of 1) is obtained for a given FFE tap when the overlap period is equal to the entire integration period (i.e., when the gating control signal $gate_k$ for the given FFE tap is asserted for the entire integration period). Moreover, an FFE coefficient of "zero" is obtained for a given FFE tap when there is no overlap between the reset signal and the gating control signal $gate_k$ for the given FFE tap (or when the gating control signal $gate_k$ is not asserted for the given FFE tap). To obtain intermediate FFE coefficient values, the overlap period between the integration period and the gating control signal for a given FFE tap can be programmatically adjusted to occur at one of a plurality of different times during the integration period (e.g., at a granularity (or resolution) of 32 steps), depending on the details of the implementation. In this regard, FFE coefficient multiplication is achieved via a time-domain approach where a given FFE tap is enabled for a fraction of the integration period so as to limit the contribution of the given tap to the final FFE-equalized voltage. This overlap period correlates to the weight factor of the FFE coefficient.

The resolution of an FFE coefficient for a given FFE tap depends on the resolution of the time-shifting circuit (block 205. FIG. 2) which generates the gating control signal that controls the given FFE tap. If the control for the time-shifting circuit is analog, true analog multiplication can be achieved. The time-shifting circuit blocks of the timing signal generator 205 shown in FIG. 2 may be implemented using variable delay elements or other similar techniques known to those of ordinary skill in the art.

From Eqn. (1) above, it is to be noted that FFE coefficient multiplication can also be implemented by varying the gain ($G_m$) of the transconductance stage. With this approach, the $G_m$ for a given source-degenerated stage is a function of both the transconductance of the differential input transistors and the value of the source-degeneration resistor. As such, this approach is less optimal as it is difficult to achieve a wide range of coefficients without sacrificing the linearity of the taps at the extremities of the range.

Figure 4:
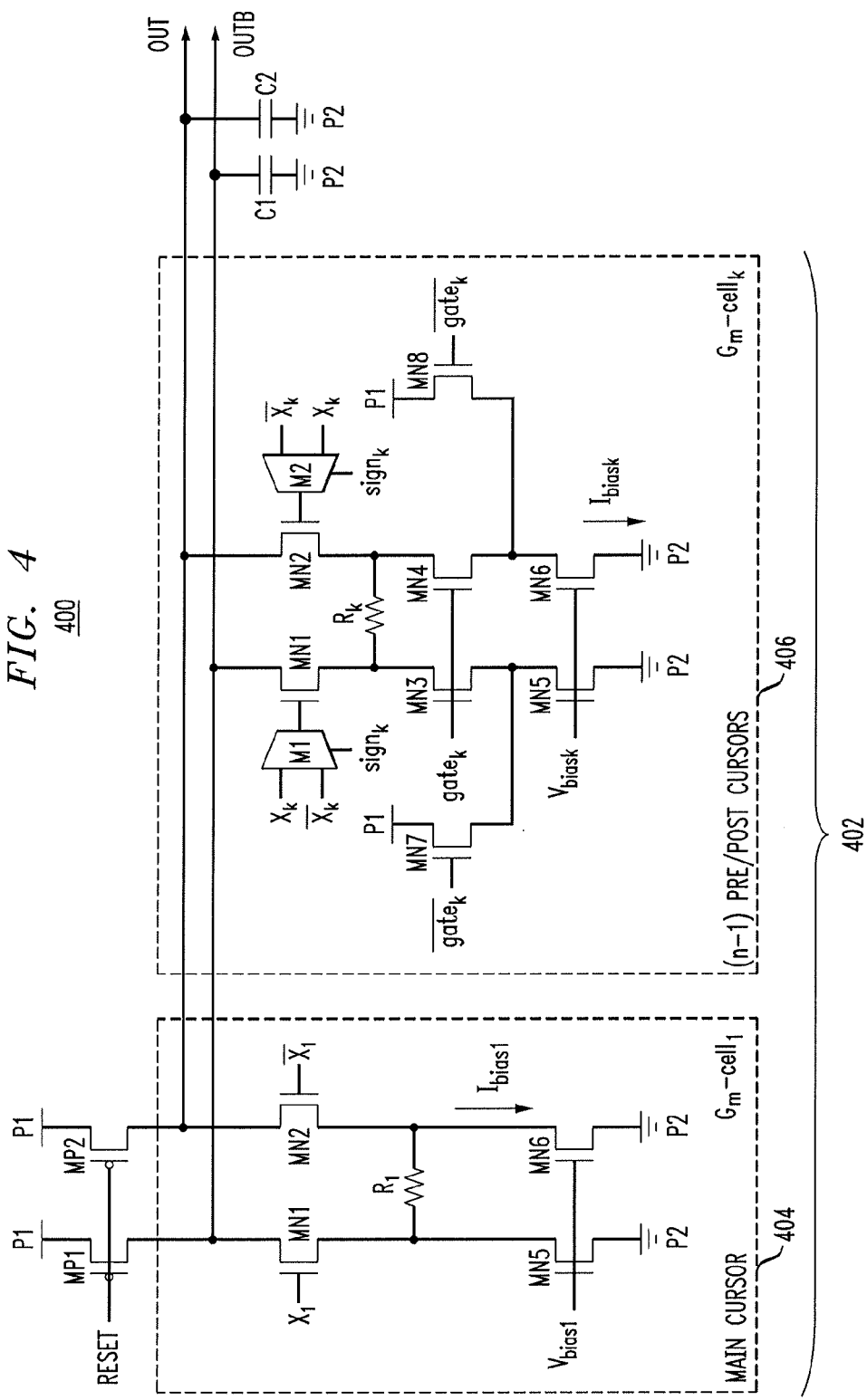
FIG. 4 is a schematic circuit diagram of a current-integrating summer circuit according to another embodiment of the invention, which is based on the general framework of FIG. 2.

FIG. 4 is a schematic circuit diagram of a current-integrating summer circuit according to another embodiment of the invention, which is based on the general framework of FIG. 2. More specifically, FIG. 4 illustrates an n-tap FFE current-integrating summer circuit 400 comprising a plurality of transconductance cells 402, first and second PMOS transistors MP1 and MP2, and first and second capacitors C1 and C2, which is similar to the current-integrating summer circuit 300 of FIG. 3A. The transconductance cells 402 comprise n FFE taps including a main cursor FFE tap 404 and a plurality (n-1) of pre-cursor and post-cursor FFE taps 406, which is similar to the transconductance cells 302 of FIG. 3A, except that the transconductance cell ($G_m\text{-cell}_k$) architecture of the pre-cursor and post-cursor FFE taps 406 shown in FIG. 4 further includes additional transistors MN7 and MN8 to steer the currents in the given FFE tap to a reference node when the gating control signal ($gate_k$) turns off the FFE tap.

More specifically, as shown in FIG. 4, the NMOS transistor MN7 is connected between the first power supply node P1 and a drain terminal of the tail current source transistor MN5, and the NMOS transistor MN8 is connected between the first power supply node P1 and a drain terminal of the tail current source transistor MN6. A complementary gating control signal $\overline{gate_k}$ is applied to the gate terminals of the NMOS transistors MN7 and MN8. As such, when the given FFE tap is disabled by a logic low gating control signal, i.e., $gate_k$=logic low, then the NMOS transistors MN7 and MN8 are turned on in response to the complementary (logic high) signal $\overline{gate_k}$, which keeps the current source transistors MN5 and MN6 in saturation even when the FFE tap is turned off. This circuit structure improves the accuracy of the FFE computation by avoiding unwanted surge currents that would otherwise introduce errors caused by repeatedly turning on and off the currents in the tail transistors MN5 and MN6 when the gating control signal $gate_k$ enables and disables the FFE tap.

Figure 5:
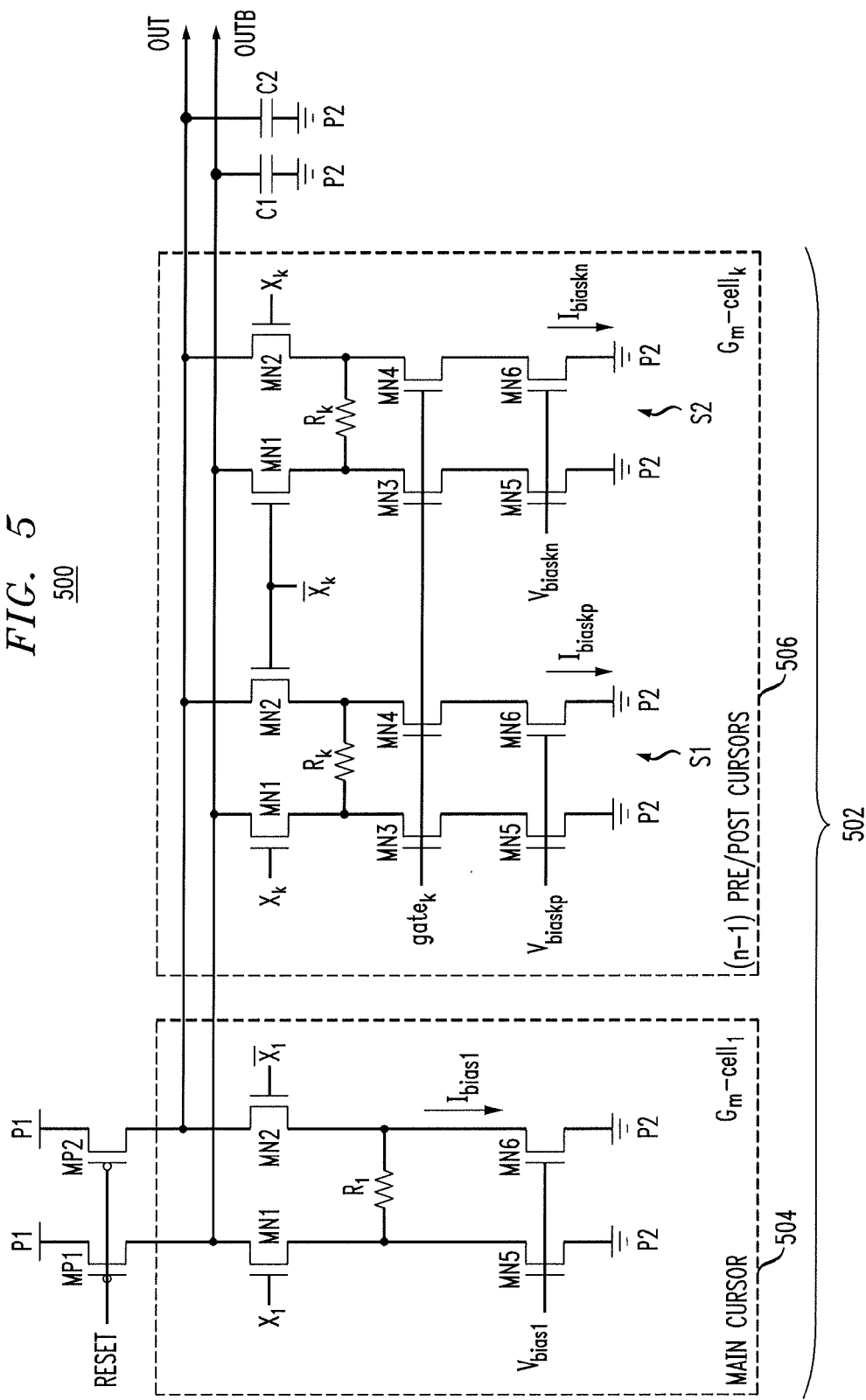
FIG. 5 is a schematic circuit diagram of a current-integrating summer circuit according to yet another embodiment of the invention, which is based on the general framework of FIG. 2.

In other embodiments of the invention, sign selection of the FFE coefficient can be implemented using techniques other than using the first and second multiplexers M1 and M2, as discussed above with reference to FIG. 3A. For example, FIG. 5 is a schematic circuit diagram of a current-integrating summer circuit 500 according to another embodiment of the invention, which is based on the general framework of FIG. 2. FIG. 5 illustrates an n-tap FFE current-integrating summer circuit 500 comprising a plurality of transconductance cells 502, first and second PMOS transistors MP1 and MP2, and first and second capacitors C1 and C2, which is similar to the current-integrating summer circuit 300 of FIG. 3A. The transconductance cells 502 comprise n FFE taps including a main cursor FFE tap 504 and a plurality (n–1) of pre-cursor and post-cursor FFE taps 506, which is similar to the transconductance cells 302 of FIG. 3A, except that the transconductance cell ($G_m$-cell$_k$) architecture of the pre-cursor and post-cursor FFE taps 506 in FIG. 5 comprises two identical transconductors that are connected to the output nodes OUT and OUTB with opposite polarities.

In particular, the transconductance cell $G_m$-Cell$_k$ shown in block 506 of FIG. 5 comprises a first transconductance amplifier stage S1 and a second transconductance amplifier stage S2, wherein the stages S1 and S2 are identical. Each stage S1 and S2 has a circuit architecture similar to the circuit architecture of the transconductor cell shown in block 306 of FIG. 3A, except that the multiplexers M1 and M2 are not implemented in the circuit of FIG. 5. Instead, sign selection is employed by applying the data signal $X_k$ to the gate terminals of the input transistor MN1 of the first stage S1 and the input transistor MN2 of the second stage S2, and applying the complementary data signal $\overline{X_k}$ to the gate terminals of the input transistor MN2 of the first stage S1 and the input transistor MN1 of the second stage S2. The pair of tail transistors MN5 and MN6 in each stage S1 and S2 are biased by separate bias voltages, $V_{biaskp}$ and $V_{biaskn}$, respectively, to generate respective bias currents $I_{biaskp}$ and $I_{biaskn}$ that flow in the first and second stages S1 and S2, respectively. The same gating control signal, $gate_k$, is commonly applied to the transistors MN3 and MN4 of the first and second stages S1 and S2.

To implement sign selection, only one of the stages S1 and S2 is activated at a given time to convert the differential input voltages of the data signal $X_k$ and $\overline{X_k}$ to an output current. For a positive (+) FFE coefficient value, the first stage S1 is activated, while the second stage S2 is deactivated. For a negative (−) FFE coefficient, the first stage S1 is deactivated, while the second stage S2 is activated. In both instances, the overlap period between the gating control signal, $gate_k$, and the integration period provides the effective FFE coefficient value. In one embodiment of the invention, the first and second stages S1 and S2 are activated/deactivated by controlling the respective bias voltages $V_{biaskp}$ and $V_{biaskn}$. In particular, to deactivate the first stage S1 or the second stage S2, the gate terminals of the tail transistors MN5 and MN6 of the first stage S1 or the second stage S2 are coupled to ground. In another embodiment of the invention, each stage S1 and S2 may be connected to the output nodes OUT and OUTB in either polarity by means of pass-gate transistor switches.

While the embodiments described thus far employ gating transistors MN3 and MN4 that are responsive to a gating control signal $gate_k$ to enable and disable the FFE taps, the gating operation can be implemented using other techniques. For example, in one embodiment of the invention, a gating operation is implemented by switchably coupling the gate terminals of the tail current source transistors MN5 and MN6 to ground voltage to disable the FFE tap. In another embodiment, the gate terminals of the FFE input differential transistor pair MN1 and MN2 may be disconnected from the FFE input signals and connected to a common-mode signal to disable the FFE tap. In yet another embodiment, the gating transistors MN3 and MN4 of the FFE taps are connected between the differential input transistor pair MN1 and MN2 and the source-degenerating resistor $R_k$.

Figure 6:
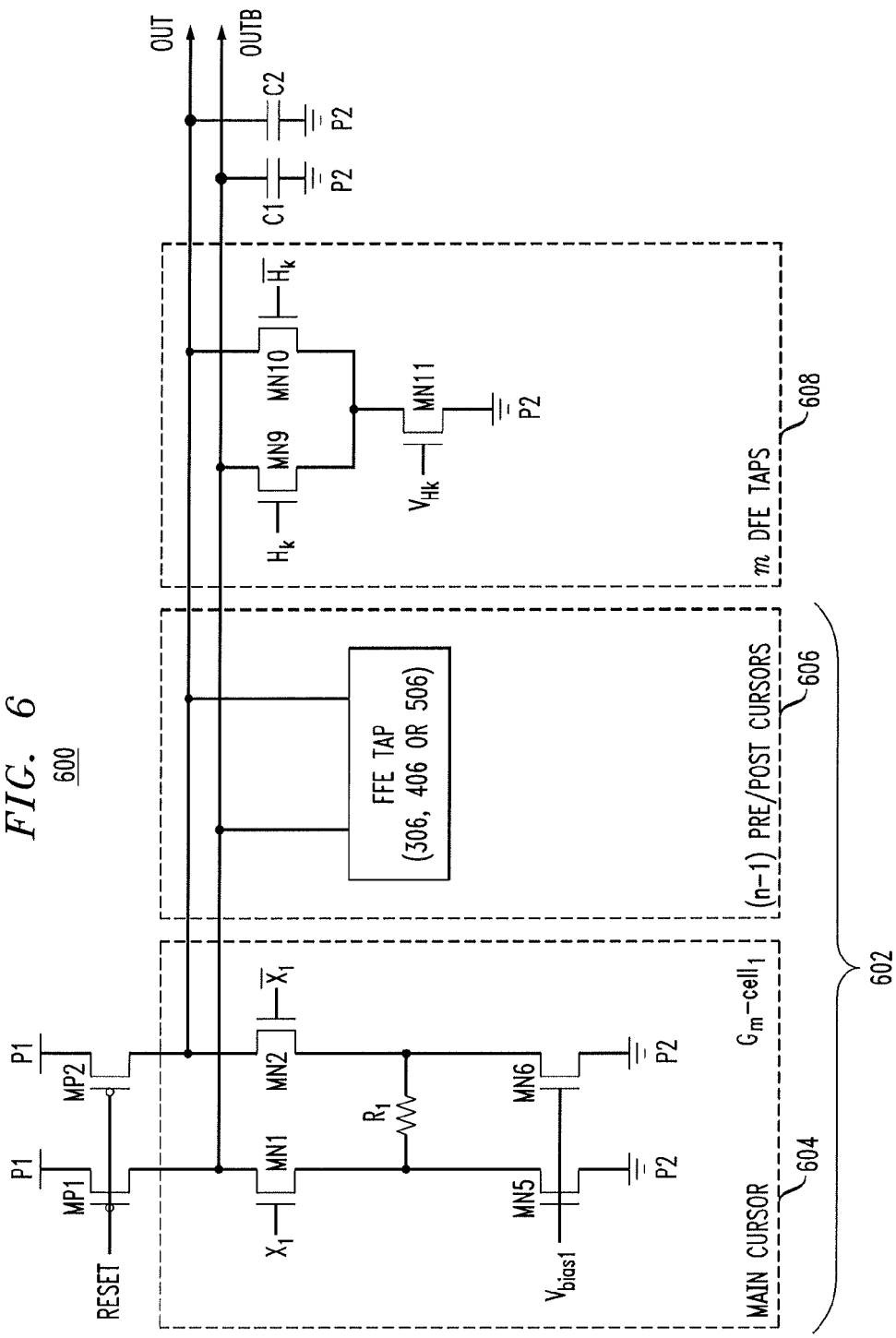
FIG. 6 is a schematic circuit diagram of a current-integrating summer circuit that incorporates n FFE taps and m DFE taps, with time domain-based multiplication for FFE coefficient multiplication, according to another embodiment of the invention.

In other embodiments of the invention, a current-integrating summer circuit can be implemented with both FFE taps and DFE (decision feedback equalizer) taps. For example, FIG. 6 is a schematic circuit diagram of a current-integrating summer circuit which incorporates n feed-forward taps and m decision feedback taps, according to another embodiment of the invention. More specifically, FIG. 6 illustrates a current-integrating summer circuit 600 that comprises a plurality of n FFE taps 602 and a plurality of m DFE taps 608. The FFE taps 602 comprise a main cursor FFE tap 604 and (n–1) FFE pre-cursor and post-cursor taps 606. The (n–1) FFE pre-cursor and post-cursor taps 606 may be implemented using any of the circuit architectures shown in blocks 306, 406 or 506 of respective FIGS. 3A, 4, and 5, as discussed above.

Furthermore, as shown in FIG. 6, each of the m DFE taps comprises a differential transistor pair MN9 and MN10 that receives as input, different feedback taps, generally denoted $H_k$ and $\overline{H_k}$. In general, as is well understood by those of ordinary skill in the art, a DFE uses the history of previously decided bits to calculate their contributions to the intersymbol interference (ISI) of the current bit so that the ISI can be cancelled. More specifically, in a DFE, the previously decided bits are fed back with weighted tap coefficients and added to the received input signal. For an m-tap DIE, the feedback taps are H1, H2, . . . , Hm. The H1 tap represents the ISI contributed by a data bit one UI earlier than the current bit being detected, the H2 tap represents the ISI contributed by a data bit two UIs earlier than the current bit, and so on. If the magnitudes and polarities of the tap weights are properly adjusted to match the channel characteristics, the ISI from the previous bits in the data stream will be cancelled, and the bits can be detected by a decision-making latch with a low BER (bit error rate).

Figure 7:
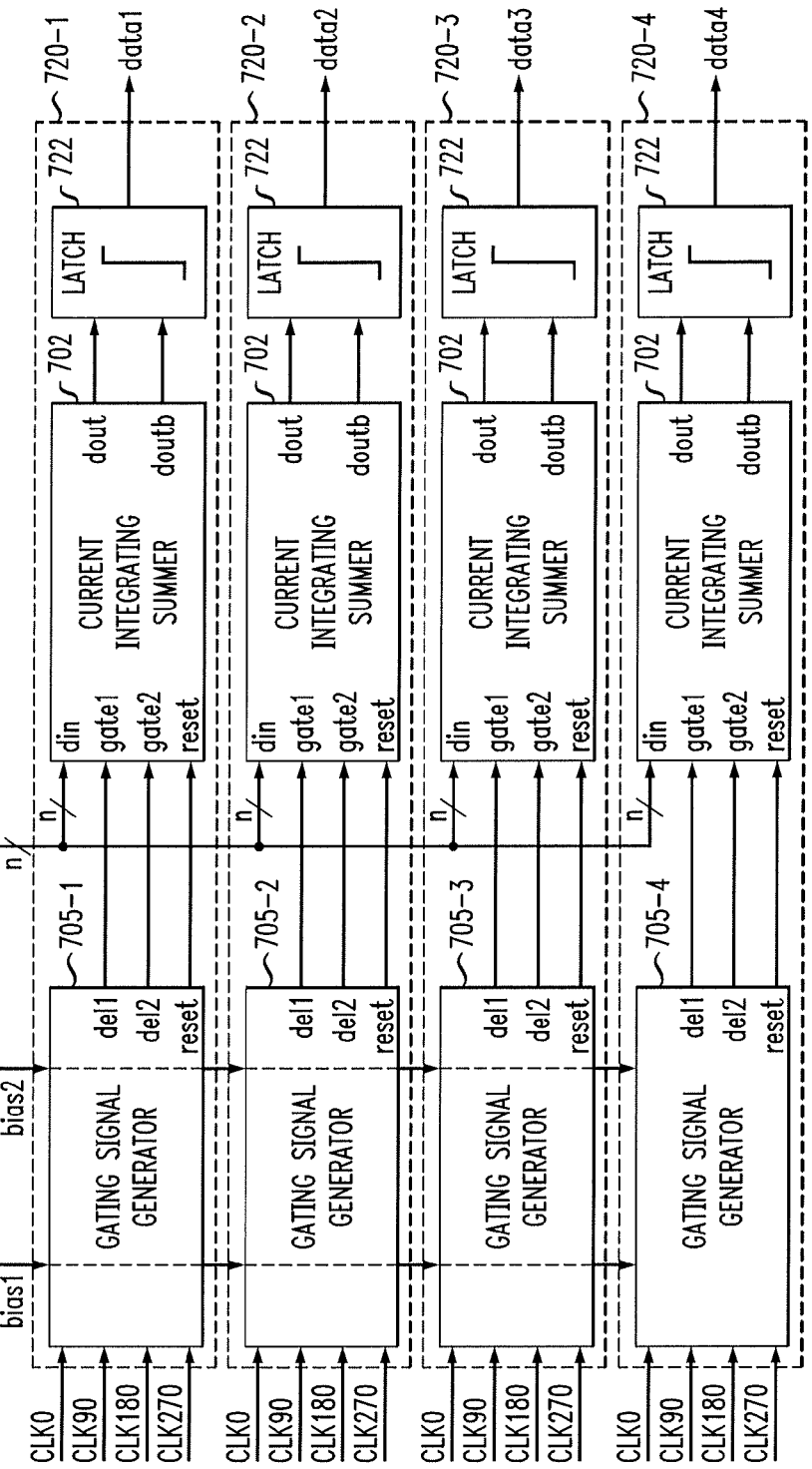
FIG. 7 is a block diagram of a quarter-rate receiver with a 3-tap FFE according to an embodiment of the invention.

FIG. 7 is a block diagram of a quarter-rate receiver with a 3-tap FFE according to an embodiment of the invention. In particular, FIG. 7 illustrates a FFE receiver circuit 700 comprising delay line circuitry 710, first and second digital-to-analog converters 715_1 and 715_2 (or DAC1 and DAC2), a plurality of parallel gating signal generators (705_1, 705_2, 705_3 and 705_4), and a plurality of parallel receiver slices (720_1, 720_2, 720_3 and 720_4). Each receiver slice (720_1, 720_2, 720_3, and 720_4) has a dedicated one of the gating signal generators (705_1, 705_2, 705_3, and 705_4). Each receiver slice (720_1, 720_2, 720_3 and 720_4) comprises an n-tap FFE current-integrating summer circuit 702 and a decision making latch 722 to resolve output of the associated current-integrating summer circuit 702.

In the example embodiment of FIG. 7, each FFE current-integrating summer circuit 702 is a 3-tap FFE current-integrating summer circuit having one main cursor FFE tap and two pre/post-cursor FFE taps, wherein the current-integrating summer circuits 702 in each of the n receiver slices (720_1, . . . , 720_4) can be implemented using any one of the embodiments shown in FIGS. 3A, 4, and 5, for example. The delay line circuitry 710 receives an input data stream having a bit rate of Y bits/sec, and generates n output streams which are distributed in parallel to data input ports (din) of the current-integrating summer circuits 702 in each of the receiver slices (720_1, . . . , 720_4).

The first and second DACs 715_1 and 715_2 receive as input respective FFE coefficients, coeff1 and coeff2. In one embodiment, the FFE coefficients coeff1 and coeff2 are digital values (as is usually the case in an adaptive FFE), and the first and second DACs 715_1 and 715_2 convert the digital bits of the FFE coefficients coeff1 and coeff2 into respective analog bias voltages bias1 and bias2. The first and second bias voltages bias1 and bias2 (which are analog representations of the digital FFE coefficients, coeff1 and coeff2) are input to each gating signal generator (705_1, 705_2, 705_3 and 705_4).

In addition to the bias voltages bias1 and bias2, each gating signal generator (705_1, 705_2, 705_3, and 705_4) receives as input four phase-shifted quadrature clock signals CLK0, CLK90, CLK180 and CLK270. In one embodiment, each gating signal generator (705_1, 705_2, 705_3 and 705_4) uses the input clocks CLK0, CLK90, CLK180 and CLK270 to generate control signals, reset, del1 and del2, which serve as reset and gating control signals (gate1 and gate2) that are applied to a respective current-integrating summer circuit 702 to adjust the FFE tap weights on pre/post-cursor stages, using methods as discussed above.

In one embodiment, the gating signal generators (705_1, 705_2, 705_3, and 705_4) are implemented using variable delay lines. In another embodiment, the gating signal generators (705_1, 705_2, 705_3, and 705_4) are implemented using phase interpolator circuits, so that the timing (phase-shift or delay) between the reset signal and the different gating control signals gate1 and gate2 can be adjusted. For example, in one embodiment of the invention, the gating signal generators (705_1, 705_2, 705_3, and 705_4) are implemented using high-resolution phase interpolation techniques as disclosed in copending, and commonly owned, U.S. patent application Ser. No. 13/538,276, filed on Jun. 29, 2012, entitled "HIGH-RESOLUTION PHASE INTERPOLATORS, which is incorporated herein by reference. An advantage of using a phase interpolator to implement the gating signal generators (705_1, 705_2, 705_3, and 705_4) is that arbitrary, fine-grained phase relationships can be obtained among the reset signal and the different gating control signals. In particular, it becomes possible to advance the gating control signal ahead of the reset signal, which creates an overlap period at the beginning of the integration period, as shown in FIG. 8, for example.

Figure 8:
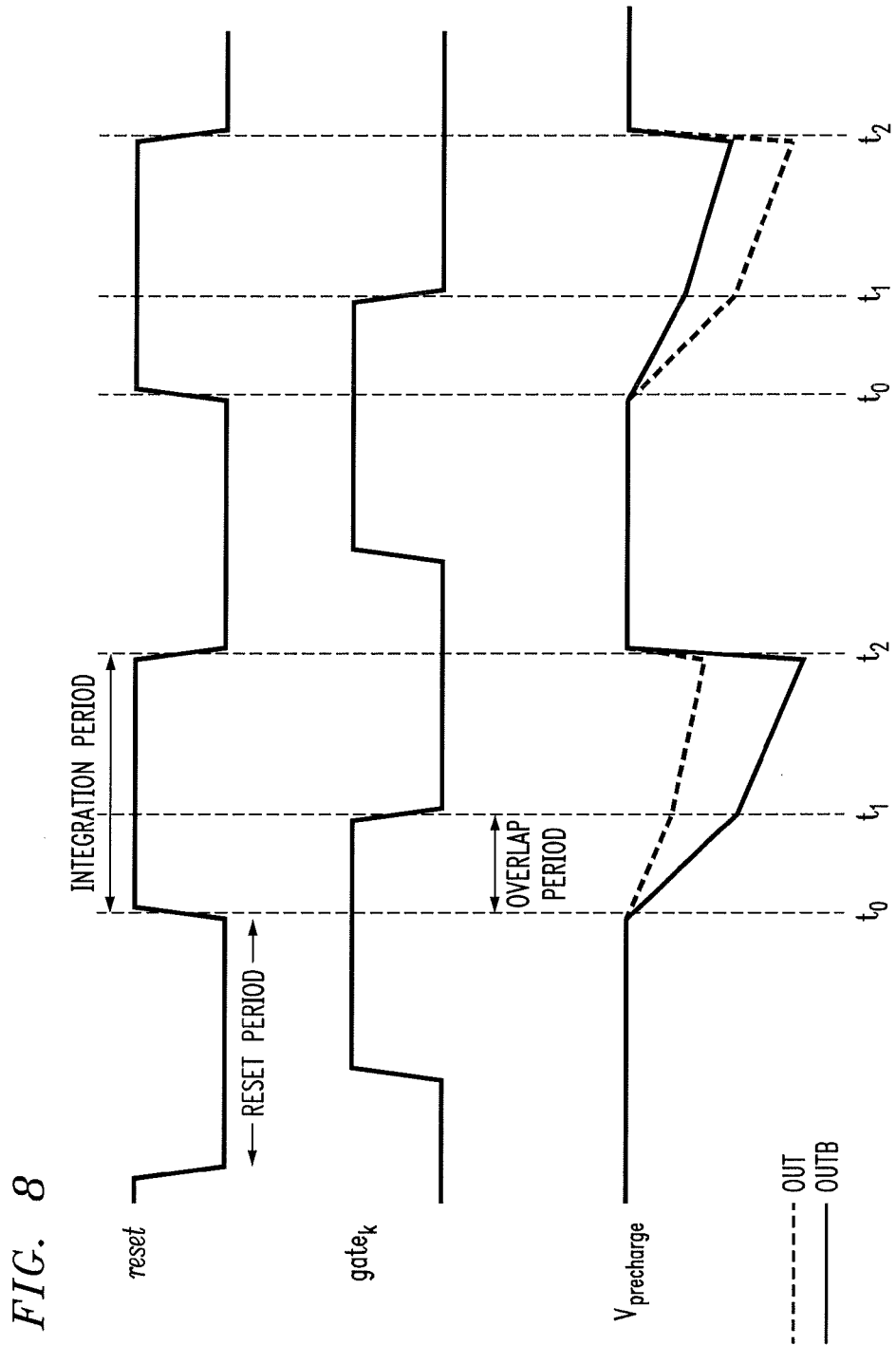
FIG. 8 shows example waveforms that illustrate an operating mode of a current-integrating summer circuit in the quarter-rate receiver of FIG. 7, according to an embodiment of the invention.

FIG. 8 shows example waveforms that illustrate an operating mode of a current-integrating summer circuit in the quarter-rate receiver of FIG. 7, according to an embodiment of the invention. FIG. 8 illustrates a reset control signal that is generated by a given one of the gating signal generators (705_1, 705_2, 705_3, and 705_4) and input to a respective current-integrating summer circuit 702. The reset control signal sets a "reset period" and an "integration period" of the current-integrating summer circuit 702. The integration period is shown in FIG. 8 to span a time interval from time $t_0$ to time $t_2$. Moreover, for purposes of clarity, FIG. 8 illustrates one gating control signal, $gate_k$, which represents the first or second gating control signal gate1 or gate2, which is generated by the given one of the gating signal generators (705_1, 705_2, 705_3, and 705_4) and input to the respective current-integrating summer circuit 702.

As further shown in FIG. 8, the gating control signal, $gate_k$, precedes the reset control signal, wherein a rising edge of the gate control signal, $gate_k$, occurs before the rising edge of the reset signal at time $t_0$. Further, a falling edge of the gate control signal, $gate_k$, occurs at time $t_1$ after the rising edge of the reset control signal, such that an "overlap period" between the reset control signal and the gate control signal, $gate_k$, occurs at the beginning of the integration period. In the example of FIG. 8, at the beginning of the integration period (e.g., time period from $t_0$ to $t_1$), the current output from a main cursor (non-gated) FFE tap and a pre/post-cursor FFE tap that is controlled by the gate control signal $gate_k$ of FIG. 8 will be integrated in the current-integrating summer circuit 702, such that both the main cursor and pre/post-cursor FFE taps will contribute to the overall FFE summation in the early portion of the integration period. When the gating signal $gate_k$ is de-asserted (at time $t_1$), the pre/post-cursor FFE tap controlled by the gate control signal $gate_k$ will be disabled, such that an average rate of discharge of the voltages of nodes OUT and OUTB decreases, in the time period of $t_1$ to $t_2$, as shown in FIG. 8.

The early overlap period shown in FIG. 8 allows implementation of FFE taps whose data inputs become invalid before the end of the integration period, using techniques as disclosed in copending, commonly owned patent application Ser. No. 13/763,312, filed on Feb. 8, 2013, entitled "Feed Forward Equalization Architectures," which is incorporated herein by reference. In general, this application describes circuits and methods for implementing a (1/n)-rate FFE receiver employing current-integrating summers so as to increase a number of FFE taps beyond an (n−1) limitation, whereby a summing interval (or integration interval) is extended beyond 1 UI (e.g., making the integration period 2 or more UI), and gating control signals serve to disable transconductance cells (FFE taps) from outputting current during periods in which their respective data inputs are not valid. This gating control method prevents the final FFE-equalized voltage from being corrupted by invalid data input signals during the integration period. The current-integrating summer circuitry stores the contributions of the FFE taps for the remainder of the integration interval so that the proper FFE-equalized voltage can be sampled at the end of the integration period. In FIG. 8, the early overlap period allows implementation of FFE taps whose data inputs become invalid before the end of the integration period.

Referring back to FIG. 7, the receiver framework shown in FIG. 7 provides an area-efficient implementation in which the first and second DACs 715_1 and 715_2 are shared among each of the four receiver slices (720_1, 720_2, 720_3 and 720_4). Indeed, since the relative phase relationships among the input clocks, the reset signal, and the gating signals are identical in each of the four receiver slices (720_1, 720_2, 720_3 and 720_4), the bias voltages bias1 and bias2 can be shared among the four receiver slices, and only two DACs (as shown in FIG. 7) are needed to generate all 8 gating control signals for four receiver slices (i.e. two gating signals gate1 and gate 2 for each current-integrating summer 702). More generally, in a 1/m-rate n-tap FFE receiver, only (n−1) DACs are required to produce all [m·(n−1)] gating control signals. In contrast, prior art implementations require [m·(n−1)] DACs to perform the FFE functions. Since DACs typically consume large area, a reduction in the number of required DACs results in significant area savings at the system level.

Other straightforward modifications and variations of the disclosed embodiments, such as changing NMOS transistors to PMOS types, and vice versa, will be obvious to those skilled in the art. Such modifications and variations do not depart from the spirit and scope of the invention.

Further aspects of the present invention provide FFE architectures with current-integrating summer circuits as described herein, which can be utilized in integrated circuit chips with various analog and digital integrated circuitries. In particular, integrated circuit dies can be fabricated having current-integrating summer circuits with FFE and DFE taps and other semiconductor devices such as field-effect transistors, bipolar transistors, metal-oxide-semiconductor transistors, diodes, resistors, capacitors, inductors, etc., forming analog and/or digital circuits. The current-integrating summer circuits can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A feed-forward equalization (FFE) circuit, comprising:
    delay circuitry to generate a plurality n of time-delayed versions of an analog input data signal;
    a current-integrating summer circuit; and
    a gating signal generator circuit that receives a clock signal and an FFE coefficient value and generates a gating control signal based on the clock signal and the FFE coefficient value, wherein the gating control signal has a phase-shift with respect to a reset control signal, wherein the reset control signal defines a reset period and an integration period for the current-integrating summer circuit, and wherein the phase-shift provides an overlap period between the gating control signal and the integration period, which corresponds to the FFE coefficient value,
    wherein the current-integrating summer circuit comprises:
        a first power supply node and an output node;
        a first switch connected between the first power supply node and the output node, wherein the first switch is responsive to the reset control signal to connect the output node to the first power supply node and precharge a capacitance of the output node during the reset period, and to disconnect the output node from the first power supply node during the integrating period; and
        a plurality m of transconductance amplifier circuits connected to the output node, wherein each of the m transconductance amplifier circuits receives an input data signal comprising one of the n time-delayed versions of the analog input data signal, and generates an output current on the output node, wherein the output currents from the m transconductance amplifier circuits collectively charge or discharge the capacitance of the output node during the integration period;
    wherein at least one transconductance amplifier circuit of the m transconductance amplifier circuits comprises a gating control circuit that is responsive to the gating control signal generated by the gating signal generator circuit, to enable the at least one transconductance amplifier circuit to generate an output current only during said overlap period between the gating control signal and the integration period so as to effectively multiply the input data signal with the FFE coefficient value corresponding to said overlap period.

2. The feed-forward equalization circuit of claim 1, wherein each of the m transconductance amplifier circuits is a differential transconductance amplifier.

3. The feed-forward equalization circuit of claim 1, wherein each of the m transconductance amplifier circuits is a differential transconductance amplifier with source degeneration.

4. The feed-forward equalization circuit of claim 1, further comprising at least one decision feedback equalization (DFE) tap connected to the output node of the current-integrating summer circuit.

5. The feed-forward equalization circuit of claim 1, wherein the capacitance of the output node comprises a discrete capacitor element that is connected between the output node and a second power supply node.

6. The feed-forward equalization circuit of claim 5, wherein the first and second power supply nodes are connected to a same power supply voltage.

7. The feed-forward equalization circuit of claim 1, wherein the capacitance of the output node comprises a parasitic capacitance.

8. The feed-forward equalization circuit of claim 1, wherein the at least one transconductance amplifier circuit of the m transconductance amplifier circuits comprises a current steering circuit, which is responsive to a complement of the gating control signal applied to the at least one transconductance amplifier circuit, to maintain a bias current source of the at least one transconductance amplifier circuit active during a portion of the integration period in which the at least one transconductance amplifier circuit is disabled by the gating control signal.

9. The feed-forward equalization circuit of claim 1, wherein the gating signal generator circuit comprises a plurality of time-delay circuits, wherein each time-delay circuit receives as input the clock signal and a corresponding FFE coefficient value, wherein each time-delay circuit generates a corresponding gating control signal, wherein each gating control signal is a time-delayed version of the clock signal with a time delay that corresponds to the FFE coefficient value, and wherein each gating control signal is input to at least one of the m transconductance amplifier circuits to implement FFE tap weights that are multiplied by input data signals of the transconductance amplifier circuits.

10. The feed-forward equalization circuit of claim 9, wherein the clock signal is the reset control signal.

11. The feed-forward equalization circuit of claim 1, wherein the FFE coefficient value is a bias voltage or current generated by a digital-to-analog converter.

12. The feed-forward equalization circuit of claim 1, further comprising a multiplexer circuit comprising a first and second input port, an output port connected to an input transistor of the at least one transconductance amplifier circuit, and a select port, wherein the input data signal is applied to the first input port of the multiplexer, wherein a complement of the input data signal is applied to the second port of the multiplexer, and wherein a sign select control signal is applied to the select port of the multiplexer circuit to select between one of the input data signal or the complement of the input data signal for input to the input transistor of at least one transconductance amplifier circuit.

13. The feed-forward equalization circuit of claim 1, wherein the at least one transconductance amplifier circuit comprises a first differential transconductance amplifier stage and a second differential transconductance amplifier stage, wherein one input of the first and second stages receives as input the input data signal, and wherein a second input of the first and second stages receives as input a complement of the input data signal, wherein sign selection is implemented by enabling only one of the first and second stages during an integration period.

14. A semiconductor integrated circuit chip, comprising an integrated circuit, the integrated circuit comprising the feed-forward equalization circuit of claim 1.

15. A 1/n-rate feed-forward equalization receiver, comprising:
    delay circuitry to generate a plurality n of time-delayed versions of an analog input data signal, wherein n is an integer greater than 1; and
    a plurality n of data processing slices, wherein each of the n data processing slices comprises a current-integrating summer circuit and a gating signal generator circuit,
    wherein the gating signal generator circuit receives a clock signal and an FFE coefficient value and generates a gating control signal based on the clock signal and the FFE coefficient value, wherein the gating control signal has a phase-shift with respect to a reset control signal, wherein the reset control signal defines a reset period and an integration period for the current-integrating summer circuit, and wherein the phase-shift provides an overlap period between the gating control signal and the integration period, which corresponds to the FFE coefficient value, and
    wherein the current-integrating summer circuit comprises:
        a first power supply node and an output node;
        a first switch connected between the first power supply node and the output node, wherein the first switch is responsive to the reset control signal to connect the output node to the first power supply node and precharge a capacitance of the output node during the reset period, and to disconnect the output node from the first power supply node during the integrating period; and
        a plurality m of transconductance amplifier circuits connected to the output node, wherein each of the m transconductance amplifier circuits receives an input data signal comprising one of the n time-delayed versions of the analog input data signal, and generates an output current on the output node, wherein the output currents from the m transconductance amplifier circuits collectively charge or discharge the capacitance of the output node during the integration period;
    wherein at least one transconductance amplifier circuit of the m transconductance amplifier circuits comprises a gating control circuit that is responsive to the gating control signal generated by the gating signal generator circuit, to enable the at least one transconductance amplifier circuit to generate an output current only during said overlap period between the gating control signal and the integration period so as to effectively multiply the input data signal with the FFE coefficient value corresponding to said overlap period.

16. The 1/n-rate feed-forward equalization receiver of claim 15 further comprising at least one digital-to-analog converter, wherein the at least one digital-to-analog converter receives a respective digital FFE coefficient value and generates an analog bias voltage that is commonly input to each gating signal generator circuit of the n data processing slices as the FFE coefficient value that is used by each gating signal generator circuit to generate the gating control signal.

17. The 1/n-rate feed-forward equalization receiver of claim 16, wherein the at least one digital-to-analog converter includes at most m digital-to-analog converters.

18. The 1/n-rate feed-forward equalization receiver of claim 15, wherein each of the n data processing slices further comprises a decision-making latch circuit connected to an output of the current-integrating summer circuit in the data processing slice.

19. A semiconductor integrated circuit chip, comprising an integrated circuit, the integrated circuit comprising the 1/n-rate feed-forward equalization receiver of claim 15.

20. A method for equalizing a data signal, comprising:
    inputting data signals to feed-forward equalization (FFE) taps of a current-integrating summer circuit, wherein the data signals are time-delayed versions of an analog input data signal;
    charging a capacitance to a precharge level during a reset period of the current-integrating summer circuit;
    generating an output current by each FFE tap during an integration period of the current-integrating summer circuit, wherein the output currents from the FFE taps collectively charge or discharge the capacitance during the integration period; and
    applying a gating control signal to a given FFE tap during the integration period of the current-integrating summer circuit to enable the given FFE tap during a portion of the integration period in which the gating control signal overlaps the integration period so as to effectively multiply the data signal input to the given FFE tap with an FFE coefficient value corresponding to a period of overlap between the gating control signal and the integration period.

21. The method of claim 20, further comprising adjusting the gating control signal to vary the period of overlap between the gating control signal and the integration period.

* * * * *